United States Patent [19]

Uchida

[11] Patent Number: 4,489,339

[45] Date of Patent: Dec. 18, 1984

[54] SOS MOSFET WITH SELF-ALIGNED CHANNEL CONTACT

[75] Inventor: Yukimasa Uchida, Yokohama, Japan

[73] Assignee: Tokyo Shibaura Denki Kabushiki Kaisha, Japan

[21] Appl. No.: 551,186

[22] Filed: Nov. 14, 1983

Related U.S. Application Data

[63] Continuation of Ser. No. 271,119, Jun. 8, 1981, abandoned.

[30] Foreign Application Priority Data

Jul. 25, 1980 [JP] Japan ................... 55-102290

[51] Int. Cl.³ ...................... H01L 29/78; H01L 27/12
[52] U.S. Cl. .......................................... 357/23; 357/4; 357/86
[58] Field of Search ................... 357/23.7, 23.9, 4, 86

[56] References Cited

U.S. PATENT DOCUMENTS

| | | | |
|---|---|---|---|
| 3,586,930 | 6/1971 | Das et al. | 357/23 MG |
| 3,786,319 | 1/1974 | Tomisaburo | 357/23 MG |
| 4,025,940 | 5/1977 | Kimura et al. | 357/23 MG |
| 4,053,916 | 10/1977 | Cricchi et al. | 357/23 TF |

FOREIGN PATENT DOCUMENTS

| | | |
|---|---|---|
| 2445985 | 4/1976 | Fed. Rep. of Germany . |
| 2637479 | 3/1977 | Fed. Rep. of Germany . |
| 1561903 | 3/1980 | United Kingdom . |

OTHER PUBLICATIONS

"CMOS/SOS EAROM Memory Arrays", Stewart, IEEE Journal of Solid–State Circuits, vol. SC-14, No. 5, Oct. 1979, pp. 860, 864.

Primary Examiner—Andrew J. James
Assistant Examiner—John Lamont
Attorney, Agent, or Firm—Finnegan, Henderson, Farabow, Garrett & Dunner

[57] ABSTRACT

A MOS type semiconductor device effectively supplying potential to a substrate region under the channel forming region of the MOS transistor on an insulating substrate. The potential is supplied to the one conductivity type substrate region under the channel forming region which is provided on an insulating substrate and has an extended portion extending in the channel length direction, through a substrate potential take-out region of one conductivity type connecting to the extended substrate. A gate electrode with an extended gate portion is formed on the substrate region through a gate insulating film, so as to cover the substrate region.

9 Claims, 8 Drawing Figures

1
(PRIOR ART)
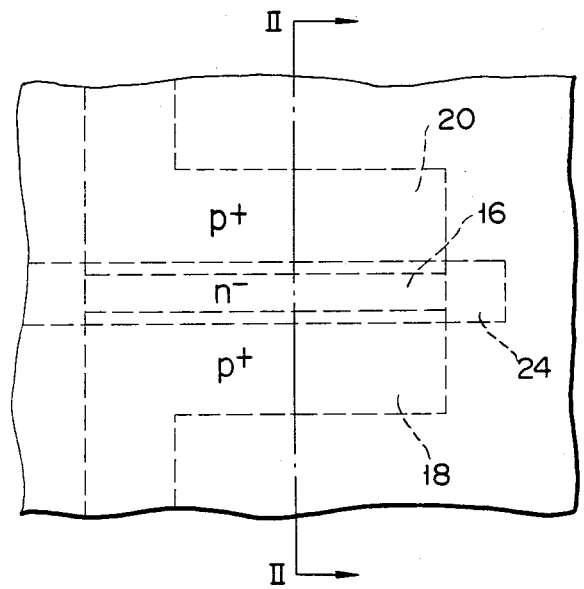
FIG. 2
(PRIOR ART)
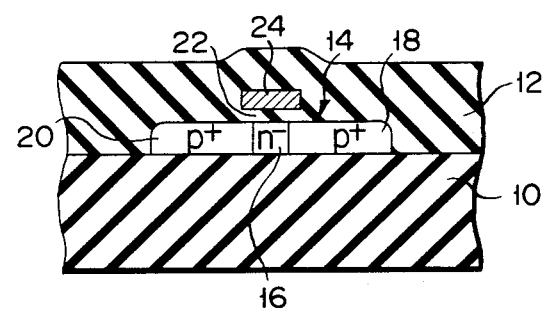

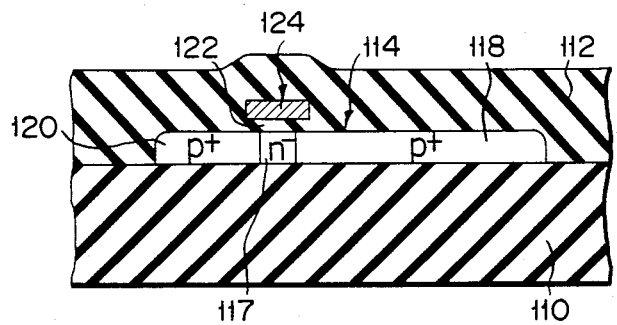
FIG. 5
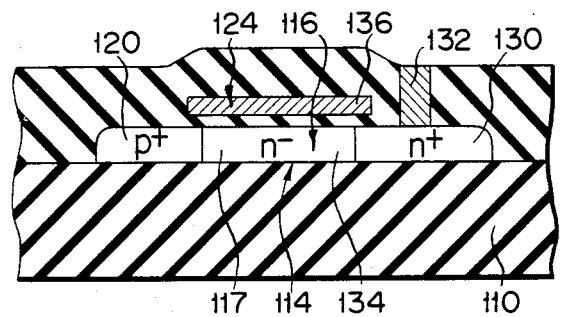
FIG. 6
FIG. 7
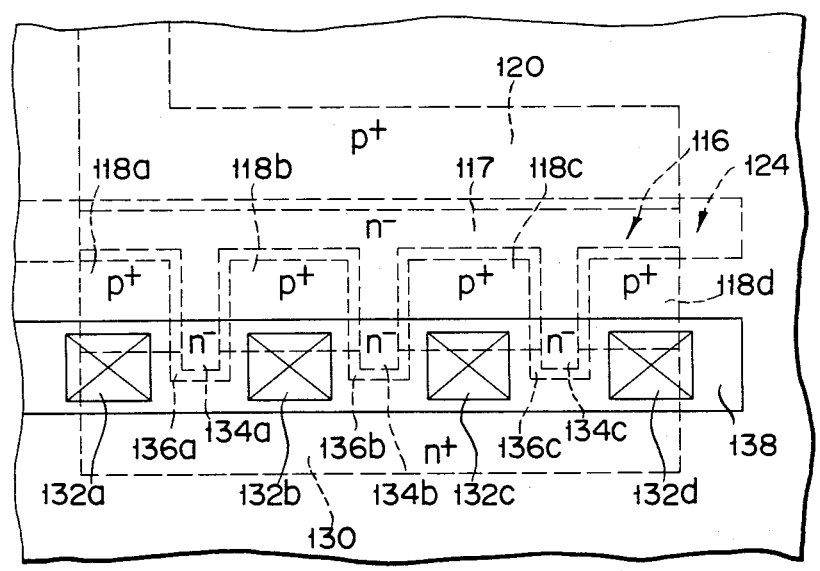

SOS MOSFET WITH SELF-ALIGNED CHANNEL CONTACT

This is a continuation of application Ser. No. 271,119, filed June 8, 1981, and now abandoned.

BACKGROUND OF THE INVENTION

The present invention relates to a MOS type semiconductor device formed on an insulating substrate.

It is known to persons skilled in the art to form an integrated circuit containing MOS transistors on a silicon epitaxial layer formed on an insulating substrate made of material with a spinel structure or sapphire. Such an integrated circuit is generally called an SOS IC. The SOS IC thus formed has many advantages: the transistors may be isolated by an insulating material; and a complementary MOS transistor circuit may be formed without forming a well structure. The latter feture provides a small parasitic capacity of interconnection and thus a small power delay product (t-p product). Further, the SOS IC does not suffer from a latch-up phenomenon which arises from the parasitic bipolar transistor and results in an erroneous operation or breakdown of the semiconductor device. Those advantages are very useful in fabricating high density MOS integrated circuits.

An exemplar of the SOS IC containing MOS transistors with a structure as shown in FIGS. 1 and 2 is known in this field. A diagram of FIG. 2 is a cross section taken along line II—II in FIG. 1. As shown, an island of a semiconductor layer 14 is provided on an insulating substrate 10 of sapphire, being covered with an insulating film 12. The island 14 comprises a source region 18 of p+ type, a drain region 20 of p+ type, and a substrate region 16 of n− type sandwiched between the source and drain regions 18 and 20. The source region 18 and the drain region 20 are in contact with the insulating substrate 10 of sapphire. A gate electrode 24 made of poly-silicon is formed above a channel region between the source region 18 and the drain region 20, with a gate insulating film 22 interposed therebetween.

In the SOS IC of the prior art, the substrate region 16 under the channel forming region of the MOS transistor is separated from the source and drain regions 18 and 20 by pn junctions. Further, it is separated from the insulating substrate 10, the insulating film 12 and the gate insulating film 22. Thus, the substrate region 16 of the MOS transistor of SOS IC is in a floating state. For this reason, it is impossible to supply potential from exterior to the substrate region 16. Therefore, the prior SOS IC has the following disadvantages:

(a) A kink appears in an $I_D - V_D$ characteristic which is a relationship of drain current $I_D$ versus drain voltage $V_D$ with a parameter of gate voltage.

(b) When a charge pumping phenomeon takes place in the substrate region 16 in a floating state, a reverse bias voltage with respect to the source potential is applied to the substrate region 16. Therefore an effective threshold voltage $V_{TH}$ of the MOS transistor shifts to an enhancement mode side (i.e. $|V_{TH}|$ increases).

(c) When a forward bias voltage with respect to the source potential is applied to the substrate region 16 in the floating state, the effective threshold voltage of the transistor shifts to a depletion mode side (i.e. $|V_{TH}|$ decreases).

Of those disadvantages, particularly the charge pumping phenomenon in item (b) causes an electrical characteristic of the MOS transistor on the insulating substrate 10 to depend upon a frequency of a drive signal. The charge pumping phenomenon further remarkably reduces a conductance of the MOS transistor formed on the insulating substrate 10. Particularly, when the previous driving states of MOS transistors have been different from each other, even if the MOS transistors have the same dimension, this phenomenon causes a difference between the conductances of the two transistors. Therefore, if this phenomenon should occur in a sense amplifier circuit having the MOS transistors of the balance type load, an erroneous operation may take place. If it should occur in a MOS transistor for a transfer gate, a circuit delay may take place.

There has been proposed an SOS IC as shown in FIG. 3 which supplies potential to the substrate region 16 so as not to render the substrate region 16 the floating state. As shown, an end portion 26 of the n− type substrate region 16 as viewed in the channel width direction and an end portion 28 of a gate electrode 24 as viewed in the channel width are expanded in the channel length direction. An n+ type impurity region 30 of the same conductivity type as that of the substrate region 16 is coupled with the end portion 26 of the substrate region 16. Potential is applied to the substrate region 16, through an electrode 32 connected to the n+ type impurity region 30. The end portion 26 of substrate region 16 is widened in a channel longitudinal direction for compensating for a displacement of the joint between the n+ type impurity region 30 and the substrate region 16.

In the case of the SOS IC with such a structure, however, it is difficult to effectively supply potential to the substrate region 16 of the MOS transistor with a large channel width W. Specifically, the potential is effectively applied from the n+ type impurity region 30 to one end of the substrate region 16 adjacent to the n+ type impurity region 30 (a portion of the substrate region from which potential is taken out). However, the potential supply to the other end of the substrate region 16 is not effective, because the other end of the substrate region 16 is apart from the impurity region 30 by a channel width W. A resistivity $\rho$ of the substrate region 16 is relatively large, and a large gate capacity is generally present between the substrate region 16 and the gate electrode 24. Therefore, it is very difficult to keep the potential of the entire substrate region 16 at the same potential as that of the impurity region 30. The resistance R of the substrate region 16 is given by the following formula (1)

$$R \simeq W \cdot \rho / T \cdot (L - \Delta L) \tag{1}$$

where $\rho$ is the resistivity of the substrate region 16, W is the channel width, L is the channel length, $\Delta L$ is a decrement of the channel length due to depletion layers at the junction between the substrate region 16 and the source region 18, and a junction between the substrate region 16 and the drain region 20, and T is a thickness of the substrate region 16.

A static capacitance (gate capacitance) between the substrate region 16 and the gate electrode is given by the following formula (2)

$$C \simeq \epsilon_{ox} \cdot W \cdot (L - \Delta L) / t_{ox} \tag{2}$$

where $t_{ox}$ is a thickness of a silicon oxide film and $\epsilon_{ox}$ is a dielectric constant of the silicon oxide film.

From the above formula (1) and (2), a time constant RC is given by a relation (3), $$RC \simeq \epsilon_{ox} \cdot W^2 \cdot \rho / t_{ox} \cdot T \quad (3)$$

For example, $\rho = 0.5$ Ω·cm, $t_{ox} = 500$ Å, $T = 0.5$ μm. In this case, $RC \simeq 7 \times W^2$ sec. When the channel width W is 10 μm, $RC \simeq 0.7$ nsec. When the channel width W is 50 μm, $RC \simeq 17.5$ nsec.

Thus, when the MOS transistor has a large channel width W, even if the potential is applied from the end of the transistor to the substrate region 16, the potential delayed by rather a large time constant RC is obtained at the other end of the transistor as shown in FIG. 3. Therefore, the potential of the substrate region 16 can not effectively be controlled.

IEEE TRANSACTIONS ON ELECTRON DEVICES, vol. ED-25, No. 8, August, 1978, p. 910 discloses a means for supplying potential to the substrate region. In the means disclosed, when the channel length L is short, for example, $L \simeq 2$ μm, it is necessary to set an accuracy of masking to L/2 or less for forming the impurity region of n+ type. If not so done, the n+ type impurity region is superposed over the drain region and the drain junction capacity between the drain region and the gate electrode increases, or the substrate region can not be connected with the n+ type impurity region. In order to limit the masking accuracy to be L/2 or less, the mask must be formed with extremely high precision, and an expensive mask aligner is needed.

SUMMARY OF THE INVENTION

Accordingly, an object of the present invention is to provide a MOS type semiconductor device which is effectively supplied potential to the substrate region of the MOS transistor on an insulating substrate.

To achieve the above object of the present invention, there is provided a MOS type semiconductor device having the following construction. Potential is applied to a substrate region of one conductivity type with an extended part extending in the channel length direction, through a region of one conductivity type for taking out the substrate potential which is connected to the extended part. A gate electrode with an extended gate portion is formed above the substrate region with a gate insulating film interposed therebetween, so as to cover the substrate region.

With such a construction, MOS transistors of any size may easily be formed on an insulating substrate without requirement of high masking accuracy and an expensive mask aligner.

Other objects and advantages of the invention will become apparent from the following detailed description when taken in conjunction with the accompanying drawings, in which:

BRIEF DESCRIPTION OF THE DRAWINGS

FIG. 1 is a plan view of an SOS IC containing conventional MOS transistors;

FIG. 2 is a cross sectional view of the SOS IC taken along line II—II in FIG. 1;

FIG. 5 is a cross sectional view of the SOS IC taken along line V—V in FIG. 4;

FIG. 6 is a cross sectional view of the SOS IC taken along line VI—VI in FIG. 4;

FIG. 7 is a plan view of another embodiment of an SOS IC according to the present invention.

DETAILED DESCRIPTION OF THE PREFERRED EMBODIMENTS

Figure 4:
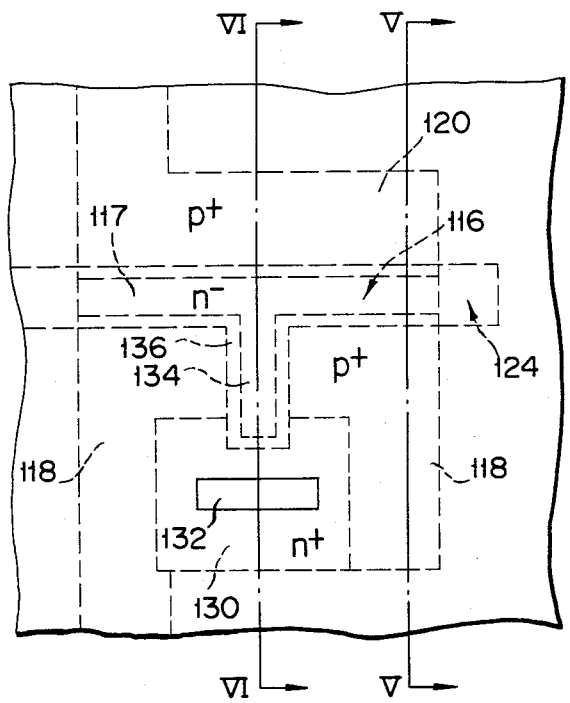
FIG. 4 is a plan view of an embodiment of an SOS IC according to the present invention.

Referring to FIGS. 4 to 6, there is shown an embodiment of a MOS type semiconductor device according to the present invention. As shown, an island of a semiconductor layer 114 is formed on an insulating substrate 110 made of sapphire, being electrically isolated by an insulating film 112 enclosing it. The island 114 comprises an n− type substrate region 116 with an extended substrate portion 134 extending in the channel length direction, a p+ type source region 118 and a drain region 120 which are formed enclosing a substrate region 116, and an n+ type region 130 for taking out a substrate potential (hereinafter referred to as "a substrate potential take-out region") contacting with the extended substrate portion 134 in the substrate region 116. The source region 118, the drain region 120, and the substrate potential take-out region 130 are all in contact with the insulating substrate 110 of sapphire. An electrode 132 is connected to the substrate potential take-out region 130. Potential is applied to the substrate region 117, through a route of the electrode 132 and the substrate potential take-out region 130.

On the substrate region 116, a gate electrode 124 made of poly-silicon is formed through a gate insulating film 122 made of SiO₂, so as to cover the substrate region 116. The gate electrode 124 has an extended gate portion 136 corresponding to the extended substrate portion 134 in the substrate region 116. The extended substrate portion 134 and the extended gate portion 136 both extend toward the source region 118.

The source region of p+ type is divided into two regions by the extended substrate portion 134 of n− type and the substrate potential take-out region 130 of n+ type.

Figure 3:
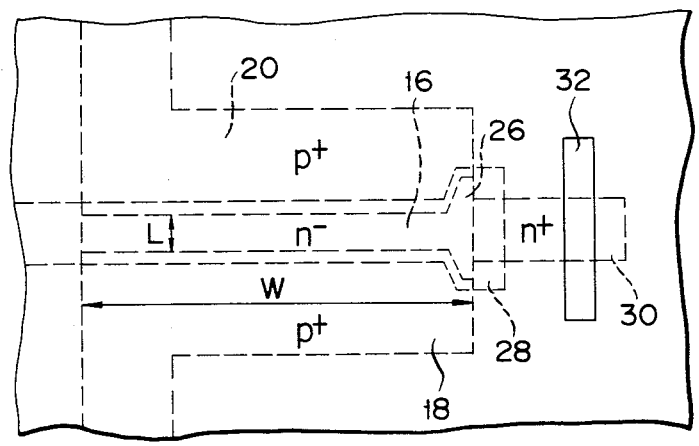
FIG. 3 is a plan view of another SOS IC containing conventional MOS transistors.

The SOS IC has a structure that the extended gate portion 136 of the gate electrode 124 is above the extended substrate portion 134 of n− type. Because of this structure, a depletion layer is hard to expand into the extended substrate portion 134. Accordingly, the potential may effectively be supplied to the substrate region 117 under the channel forming region, through the extended substrate portion 134 coupled with the substrate potential take-out region 130 of n+ type. Therefore, accordingly to this MOS type semiconductor device, the potential in the substrate region 117 under the channel forming region of n− type may effectively be controlled at a small time constant, compared with the conventional SOS IC shown in FIG. 3. For example, the SOS IC of the present invention with the same channel length and width as the conventional SOS IC as shown in FIG. 3 has about one fourth times the time constant as compared with that of the conventional SOS IC. Of course, there never occur the kink phenomenon in the $I_D - V_D$ characteristic or the shift of the effective threshold voltage to the enhancement mode.

The extended substrate portion 134 may be formed integral with the substrate region 117 under the channel forming region. The connection of the extended substrate portion 134 with the substrate potential take-out region 130 may readily be made by properly selecting the extending length of the extended substrate portion 134. According to the present invention, even in the transistor of MOS type of which the size of the substrate region 116 as viewed in the channel length direction is short, the substrate potential take-out region 130 for effectively supplying the potential to the substrate region 117 under the channel forming region may easily be formed without any special technique.

FIG. 7 shows another embodiment of a MOS type semiconductor device according to the present invention. The substrate region 116 of $n^-$ type formed on the insulating substrate has three extended substrate portions 134a, 134b and 134c. On the substrate region 116, the gate electrode 124 is formed through the gate insulating film, so as to cover the substrate region 116. As shown, the extended gate portion 136a is disposed above the extended substrate portion 134a; the extended gate portion 136b above the extended substrate portion 134b; the extended gate portion 136c above the extended substrate portion 134c. The end portions of the extended substrate portions 134a, 134b and 134c are connected to the $n^+$ type substrate potential take-out region 130 of a stripe shape disposed adjacent to the source regions 118a, 118b, 118c and 118d which are separated one another. Four electrodes 132a, 132b, 132c and 132d range over the source regions 118a, 118b, 118c and 118d and the substrate potential take-out region 130, respectively, in order to make the potential of the substrate region 117 under the channel forming region equal to the potential in the source regions 118a to 118d. Those electrodes 132a, 132b, 132c and 132d are connected one another by an aluminum interconnection 138.

With such a construction, the substrate region 117 under the channel forming region of the MOS transistor may be connected to the substrate potential take-out region 130 of the MOS transistor, through the extended substrate portions 134a, 134b and 134c of $n^-$ type under the extended gate portions 136a to 136c of the gate electrodes 124. Further, the substrate potential take-out region 130 may be connected to the source regions 118a to 118d, through electrodes 132a to 132d and the aluminum interconnection 138. Therefore, the source regions 118a to 118d may be connected to the substrate region 117 under the channel forming region, with the result that the potential of the substrate region 117 of $n^+$ type under the channel forming region may be controlled at a small time constant, compared with the conventional SOS IC.

Figure 8:
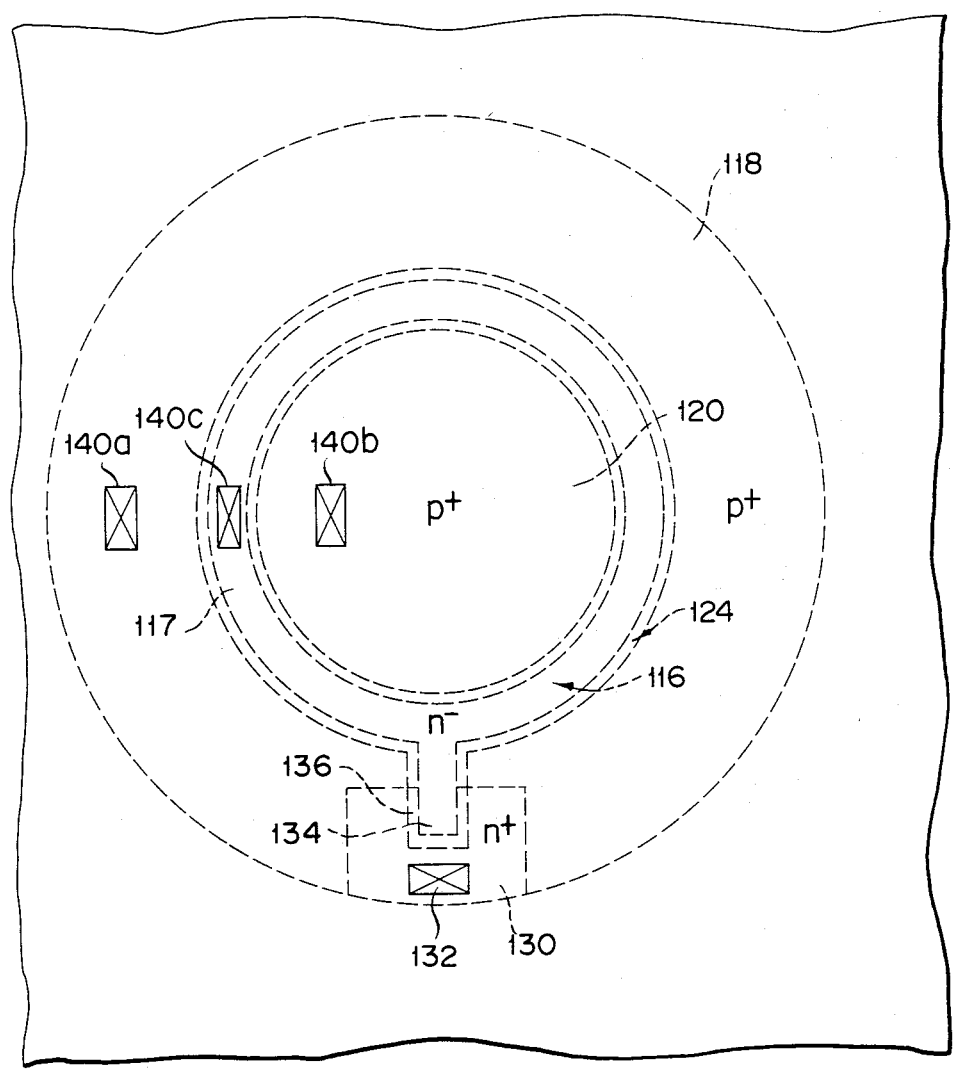
FIG. 8 is a plan view of an SOS IC which is a modification of the present invention.

FIG. 8 shows a modification of a MOS type semiconductor device according to the present invention. The substrate region 116 of $n^-$ type formed on the insulating substrate made of sapphire comprises a circular portion 117 under the channel forming region and an extended substrate portion 134. Formed on the substrate region 116 is a gate electrode 124 so as to cover the substrate region 116, through an $SiO_2$ film. The gate electrode 124 made of poly-silicon has an extended gate portion 136 corresponding to the extended substrate portion 134. A circular drain region 120 of $p^+$ type is provided within the substrate region 116. A source region 118 of $p^+$ type is provided outside the substrate region 116. Connected to the extended substrate portion 134, the substrate potential take-out region 130 of $n^+$ type is supplied with the potential from an electrode 132. With such a construction, the potential may effectively be supplied to the substrate region 117 under the channel forming region. The source region 118, the drain region 120 and the gate electrode 124 are respectively connected to electrodes 140a to 140c.

The MOS type semiconductor device according to the present invention may be modified such that the extended substrate and gate portions may be provided extending toward the drain region without limitation to the above-mentioned embodiments, the portions being extended to the source region. In the semiconductor device modified, the voltage to be applied to the extended portion of the substrate region is limited within a range in which the potential in the substrate region is not equal to that in the drain region.

The MOS type semiconductor device according to the present invention is applicable for the n-channel MOS transistor without limitation to its application as described in the above-mentioned embodiments comprising the p-channel MOS transistor. In the case of the n-channel MOS transistor, the substrate region is of the $p^-$ type and the substrate potential take-out region is of the $p^+$ type.

What is claimed is:

1. A MOS type semiconductor device comprising:
   an insulating substrate;
   a substrate region of one conductivity type provided on said insulating substrate, said substrate region positioned under a channel region, and said substrate region having an extended substrate portion extending in the channel length, which is the direction of current flow, away from said channel region;
   a source region of an opposite conductivity type which is provided in said insulating substrate, contacting one side surface of said substrate region under said channel region;
   a drain region of the opposite conductivity type which is provided on said insulating substrate, contacting the other side surface of said substrate region under said channel region, the pair of said source and drain regions being separately formed sandwiching said substrate region under the channel region and said extended substrate portion extending to one of said source and drain regions;
   a gate insulating film provided on said substrate region;
   a gate electrode provided on said gate insulating film so as to cover said substrate region, said gate electrode having an extended gate portion corresponding to said extended substrate portion of said substrate region; and
   a substrate potential takeout region of one conductivity type which is provided on said insulating substrate and is connected to said extended substrate portion of said substrate region, whereby potential may be applied to said substrate region under the channel region through said substrate potential take-out region.

2. The MOS type semiconductor device according to claim 1, wherein said substrate region has a plurality of extended substrate portions extending in the channel length direction, and said gate electrode has a plurality of extended gate portions corresponding to said extended substrate portions of said substrate region.

3. The MOS type semiconductor device according to claim 2, wherein said substrate potential take-out region is commonly connected to the plurality of said extended substrate portions to supply potential to said substrate region under the channel forming region.

4. The MOS type semiconductor device according to any one of claims 1 to 3, wherein said extended substrate portion extends toward said source region.

5. The MOS type semiconductor device according to claim 4, wherein an electrode is formed ranging over said substrate potential take-out region and said source region.

6. The MOS type semiconductor device according to claim 1, wherein said substrate region is formed in a closed shape, within which said source region or said drain region is present, and has said extended substrate portion at a part thereof.

7. The MOS type semiconductor device according to claim 6, wherein said substrate region under the channel forming region is circular in shape.

8. The MOS type semiconductor device according to claim 6 or 7, wherein said extended substrate portion extends toward said source region.

9. The MOS type semiconductor device according to claim 8, wherein a contact hole is formed ranging over said substrate potential take-out region and said source region.

* * * * *

UNITED STATES PATENT AND TRADEMARK OFFICE
CERTIFICATE OF CORRECTION

PATENT NO. : 4,489,339

DATED : December 18, 1984

INVENTOR(S) : Uchida

It is certified that error appears in the above—identified patent and that said Letters Patent is hereby corrected as shown below:

Claim 1, line 29, after "channel length" insert --direction--.

Signed and Sealed this

Fourteenth Day of May 1985

[SEAL]

Attest:

DONALD J. QUIGG

*Attesting Officer*  *Acting Commissioner of Patents and Trademarks*